United States Patent
Neil et al.

(10) Patent No.: US 9,634,447 B1
(45) Date of Patent: Apr. 25, 2017

(54) ELECTRICAL COMMUNICATION ADAPTER SYSTEM HAVING AN ADAPTER BOARD ASSEMBLY AND CONNECTOR FOR INTERFACING WITH MILITARY COMMUNICATION SYSTEMS

(71) Applicant: IXI Technology, Yorba Linda, CA (US)

(72) Inventors: Roberto Neil, Corona, CA (US); David Rodriguez, Ladera Ranch, CA (US); Joe Truong, Westminster, CA (US); Jin Qiao, Yorba Linda, CA (US); Esther Heras, Corona, CA (US)

(73) Assignee: IXI Technology, Yorba Linda, CA (US)

( * ) Notice: Subject to any disclaimer, the term of this patent is extended or adjusted under 35 U.S.C. 154(b) by 0 days.

(21) Appl. No.: 14/945,401

(22) Filed: Nov. 18, 2015

(51) Int. Cl.
*H05K 1/00* (2006.01)
*H01R 31/06* (2006.01)

(52) U.S. Cl.
CPC .................... *H01R 31/06* (2013.01)

(58) Field of Classification Search
CPC ........................................................ H01R 31/06
USPC ....... 439/655, 638, 76.1, 362, 445, 694, 696
See application file for complete search history.

(56) References Cited

U.S. PATENT DOCUMENTS

| | | | | |
|---|---|---|---|---|
| 5,219,294 A * | 6/1993 | Marsh | ................ | H01R 23/6873 439/607.28 |
| 6,210,179 B1 * | 4/2001 | Lausberg | ............ | H05K 7/1472 439/67 |
| 6,761,583 B2 * | 7/2004 | Ortowski | ............. | H01R 13/748 439/491 |
| 7,108,544 B2 * | 9/2006 | Zoller | ................ | B65H 75/4473 242/400.1 |
| 7,128,616 B1 * | 10/2006 | Orr | ...................... | H01R 13/518 439/579 |
| 7,168,989 B2 * | 1/2007 | Faulkner | .............. | H01R 31/065 439/620.22 |
| 7,719,849 B2 * | 5/2010 | Blashewski | .......... | G01R 1/0408 174/50 |
| 8,021,194 B2 * | 9/2011 | Jatou | .................... | H01R 31/065 439/638 |
| 8,581,099 B2 * | 11/2013 | Ger | .......................... | H02G 3/16 174/50 |
| 2002/0009905 A1 * | 1/2002 | Poplawski | ........... | C07D 491/22 439/76.1 |
| 2002/0142630 A1 * | 10/2002 | Molus | ................. | H01R 13/741 439/76.1 |

(Continued)

*Primary Examiner* — Abdullah Riyami
*Assistant Examiner* — Nelson R Burgos-Guntin
(74) *Attorney, Agent, or Firm* — The Watson I.P. Group, PLC; Jovan N. Jovanovic; Vladen M. Vasiljevic

(57) ABSTRACT

An adapter system suited suitable for use in association with legacy military connectors including an adapter board assembly and an electrical cable connector. The adapter board assembly includes a pair of legacy connectors and a high density connector. A connector attachment block is attached to the adapter board assembly. The electrical cable connector includes a first side coupling assembly, a second side coupling assembly and a cable member extending therebetween. The first side coupling includes a connector matingly electrically attachable to the high density connector of the adapter board assembly, and a housing attachable to the connector attachment block. The adapter board assembly and the electrical cable connector are likewise separately disclosed.

20 Claims, 17 Drawing Sheets

(56) References Cited

U.S. PATENT DOCUMENTS

| | | | |
|---|---|---|---|
| 2007/0059978 A1* | 3/2007 | Rohrbach | H01R 13/665 439/502 |
| 2010/0112866 A1* | 5/2010 | Friedhof | H01R 13/6683 439/620.22 |
| 2012/0282813 A1* | 11/2012 | Ballard | H01R 13/6215 439/638 |
| 2014/0134887 A1* | 5/2014 | Soubh | H01R 12/724 439/638 |

* cited by examiner

ELECTRICAL COMMUNICATION ADAPTER SYSTEM HAVING AN ADAPTER BOARD ASSEMBLY AND CONNECTOR FOR INTERFACING WITH MILITARY COMMUNICATION SYSTEMS

CROSS-REFERENCE TO RELATED APPLICATION

N/A

BACKGROUND OF THE DISCLOSURE

1. Field of the Disclosure

The disclosure relates in general to electrical communication cables, and more particularly, to an adapter system having an adapter board assembly and connector for military communication systems, such as NTDS, connecting legacy military interfaces, such as MILSTD-1397C Type A, B, C or H, for example, to PCI, PMC, PCIe, cPCIe and cPCI equipment and computer hardware boards having connectors other than those associated with military interfaces.

2. Background Art

Deployed since the early 1960's the Naval Tactical Data System (NTDS) is the information processing system employed by the United States Navy, among other armed forces. Many of the connectors and interfaces of the NTDS system are defined by MIL-STD-1397. Over time, as technology has progressed, it has become necessary to couple newer electrical devices and systems to legacy NTDS systems.

Many connectors and systems have been developed to couple such legacy equipment to newer technological devices (i.e., PCT, PMC, PCIe, cPCIe and cPCI, to name a few). Problematically, many such adapters or connectors can be prone to failure in the electrical connections. This is because, in many cases, the connectors themselves are in a position to provide the mechanical support. Additionally, many of the adapters are limited in configuration which renders that coupling between newer devices and legacy devices difficult, especially with special constraints that are often found on Naval ships and the like. With relatively low production volumes for connectors, it is highly advantageous to make connectors that have a range of assembly options.

SUMMARY OF THE DISCLOSURE

The disclosure is directed an adapter system comprising an adapter board assembly and an electrical cable connector. The adapter board assembly includes a board member, a first legacy connector, a second legacy connector, a high density connector and a connector attachment block. The board member has a central portion, a first side portion, and a second side portion as well as a top surface and a bottom surface. The first legacy connector extends from the bottom surface of the board member and is structurally configured to receive a first legacy military connector and electrically coupling thereto. The second legacy connector extends from the bottom surface of the board member and is structurally configured to receive a second legacy military connector and electrically coupling thereto. The high density connector extends from one of the top surface and the bottom surface of the board member. The high density connector is electrically coupled to the first and second legacy connectors, to, in turn, electrically couple the high density connector with the first and second legacy military connectors. The connector attachment block extends about the high density connector, and is a separate member. The connector attachment block includes a board coupling configured to couple the connector attachment block to the board member. The connector attachment block includes a connector coupling on an upper surface of the outer periphery.

Further, the electrical cable connector has a first side coupling assembly, a second side coupling assembly and a cable member extending therebetween. The first side coupling including a connector matingly electrically attachable to the high density connector of the adapter board assembly. The first side coupling further includes a housing, with the housing having a fastener attachable to the connector coupling of the connector attachment block to releasably couple the housing of the first side coupling assembly to the connector attachment block, to, in turn, maintain an electrical coupling between the high density connector and the connector of the first side coupling assembly.

In some configurations, the connector attachment block further includes an outer periphery defining a central opening. The high density connector is accessible within the central opening.

In some configurations, the outer periphery defines a rectangular member having a first side, a second side, a first end and a second end. The board coupling comprises a plurality of threaded bores configured to receive fasteners which sandwich the board member therebetween. The plurality of threaded bores extending into the first end and the second end of the outer periphery.

In some configurations, at least a portion of the first and second ends extends further away from the board member to define a height that is greater than a height of the first side and the second side. The connector coupling further comprises a corresponding threaded bore positioned on a top surface of each one of the first end and the second end of the outer periphery.

In some configurations, the connector attachment block comprises a monolithic integrally formed member.

In some such configurations, the connector attachment block is formed from an electrically conductive material.

In some configurations, the housing of the first side coupling assembly includes a central body portion, a first retention wing, and a second retention wing opposite of the first retention wing. Each of the first and second retention wings having a bore extending therethrough, corresponding to the threaded bores of the connector coupling of the connector attachment block. A releasably threaded fastener is configured to extend through a bore of the first retention wing and into one of the threaded bores of the connector attachment block. A second releasably threaded fastener is configured to extend through the bore of the second retention wing and into a second one of the threaded bores of the connector attachment block, all upon electrical coupling of the high density connector with the connector of the electrical cable connector.

In some configurations, the housing of the first side coupling assembly further includes a plurality of cable openings, including a top cable opening, a first side cable opening and a second side cable opening. The openings of the first and second side are substantially parallel to each other. The top cable opening is substantially perpendicular thereto. The cable member extends through one of the plurality of cable openings, with a cover being positioned over the other of the cable openings.

In some configurations, the first legacy connector and the second legacy connector each further comprise a mating housing comprising a cylindrical member, a coupling mechanism extending between the mating housing and the board member, and a plurality of connection pins positioned within the mating housing and electrically coupled to the board member.

In some configurations, the coupling mechanism further comprises a flange member extending from the coupling mechanism, and a plurality of fasteners extending between the flange member and the board member.

In some configurations, the first and second legacy connectors extend from the bottom surface of the board member. The high density connector extends from the top surface of the board member. The high density connector is positioned on the central portion of the board member, with the first legacy connector being positioned on the first side portion of the board member and the second legacy connector being positioned on the second side portion of the board member.

In another aspect of the disclosure, the disclosure is directed to an adapter board assembly that is configured for use in association with an adapter system. The adapter board assembly includes a board member, a first legacy connector, a second legacy connector, a high density connector, and a connector attachment block. The board member includes a central portion, a first side portion, and a second side portion, a top surface and a bottom surface. The first legacy connector extends from the bottom surface of the board member, and is structurally configured to receive a first legacy military connector and electrically coupling thereto. The second legacy connector extends from the bottom surface of the board member, and is structurally configured to receive a second legacy military connector and electrically coupling thereto. The high density connector extending from one of the top surface and the bottom surface of the board member. The high density connector is electrically coupled to the first and second legacy connectors, to, in turn, electrically couple the high density connector with the first and second legacy military connectors. The connector attachment block extends about the high density connector, and is a separate member. The connector attachment block includes a board coupling configured to couple the connector attachment block to the board member, and includes a connector coupling on an upper surface of the outer periphery.

In some configurations, the connector attachment block further includes an outer periphery defining a central opening. The high density connector is accessible within the central opening.

In some configurations, the outer periphery defines a rectangular member having a first side, a second side, a first end and a second end. The board coupling comprising a plurality of threaded bores configured to receive fasteners which sandwich the board member therebetween. The plurality of threaded bores extend into the first end and the second end of the outer periphery.

In some configurations, at least a portion of the first and second ends extending further away from the board member to define a height that is greater than a height of the first side and the second side. The connector coupling further comprising a corresponding threaded bore positioned on a top surface of each one of the first end and the second end of the outer periphery.

In some configurations, the first legacy connector and the second legacy connector each further comprise a mating housing comprising a cylindrical member, a coupling mechanism extending between the mating housing and the board member, and a plurality of connection pins positioned within the mating housing and electrically coupled to the board member.

In some configurations, the coupling mechanism further comprises a flange member extending from the coupling mechanism, and a plurality of fasteners extending between the flange member and the board member.

In another aspect of the disclosure, the disclosure is directed to an electrical cable connector. The electrical cable connector includes a first side coupling assembly, a second side coupling assembly and a cable member extending therebetween. At least one of the first side coupling and the second side coupling further including: a housing and an electrical connector. The housing includes a central body portion as well as a first retention wing and a second retention wing, each flanking a lower connector opening at a proximal end thereof. The housing further including a plurality of cable openings at a distal end thereof. The electrical connector portion including a board attached to the housing, a cable clamp member attached to the board, and a connector electrically coupled to the board. The connector extends at least partially through the lower connector opening of the housing. The cable member is configured to extend through one of the plurality of cable openings and electrically attachable to the board and to the connector.

In some configurations, the plurality of cable openings further includes a top cable opening, a first side cable opening and a second side cable opening. The top cable opening is perpendicular to each of the first side and the second side cable openings. The cable clamp member is positionable in a different orientation relative to the board. In particular, the cable clamp is positionable in a first orientation when the cable member extends through the top cable opening, in a second orientation when the cable member extends through the first side cable opening and in a third orientation when the cable member extends through the second side cable opening.

In some configurations, the cable clamp member includes a first column, a second column spaced apart from the first column, with a cross member extending therebetween to define an opening. Coupling of the cable clamp member to the board sandwiches the cable member between the cross member and the board to, releasably retain the cable member therebetween.

BRIEF DESCRIPTION OF THE DRAWINGS

The disclosure will now be described with reference to the drawings wherein.

DETAILED DESCRIPTION OF THE DISCLOSURE

Figure 1:
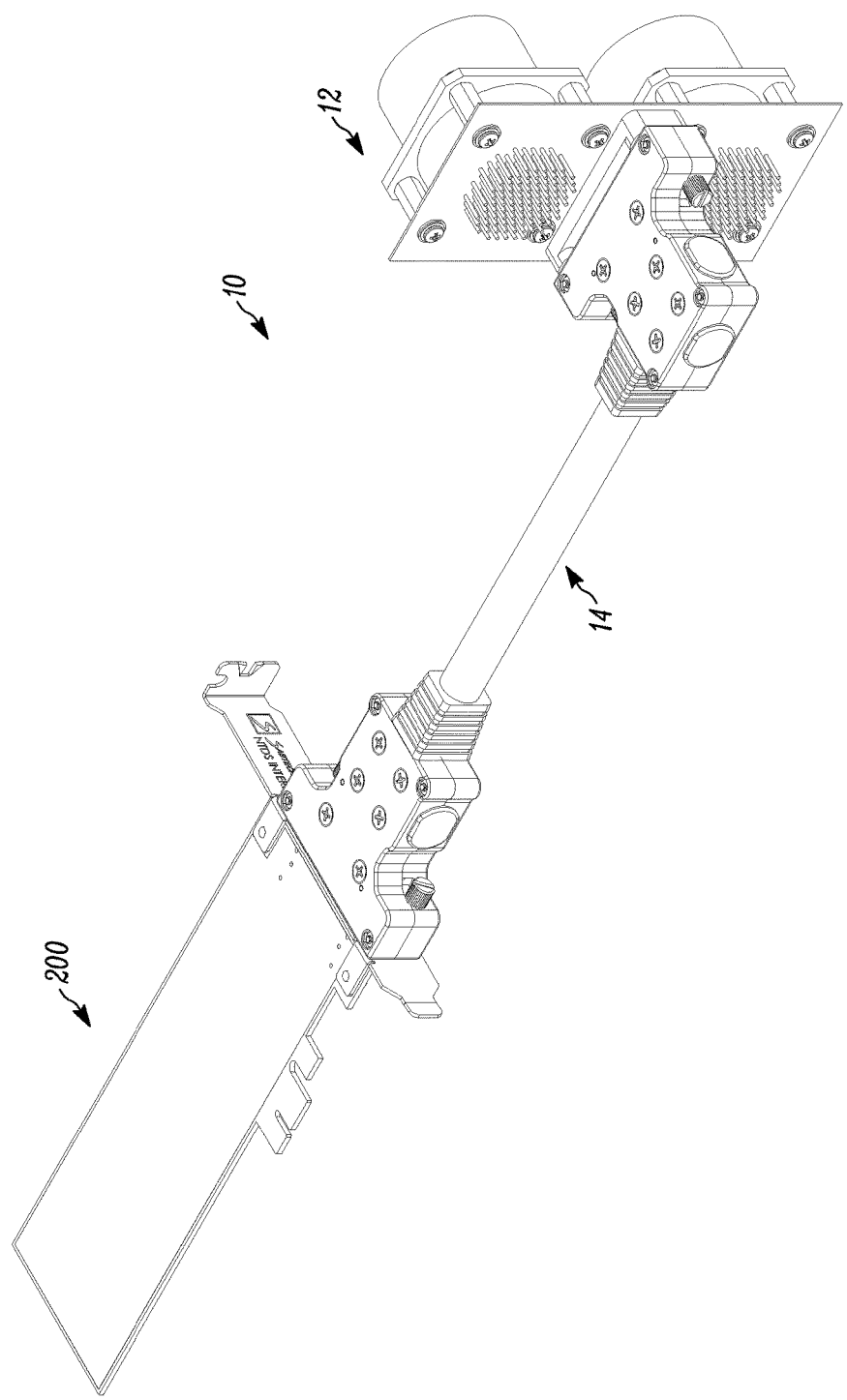
FIG. 1 of the drawings is a perspective view of the adapter system showing, the adapter board assembly, the electrical cable connector and a board of a computing device in a coupled configuration.
Figure 2:
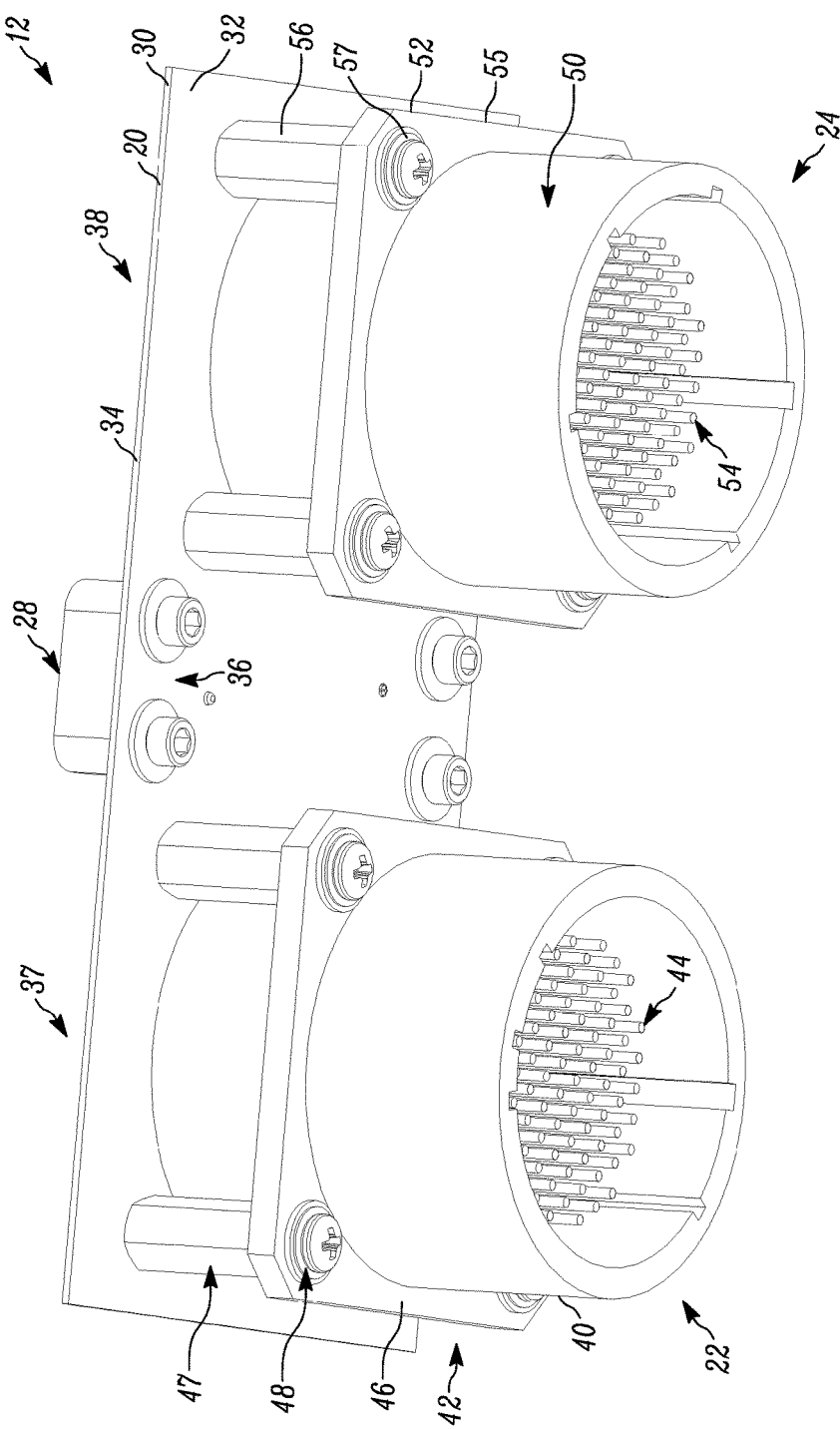
FIG. 2 of the drawings is a bottom perspective view of the adapter board assembly of the present disclosure.
Figure 3:
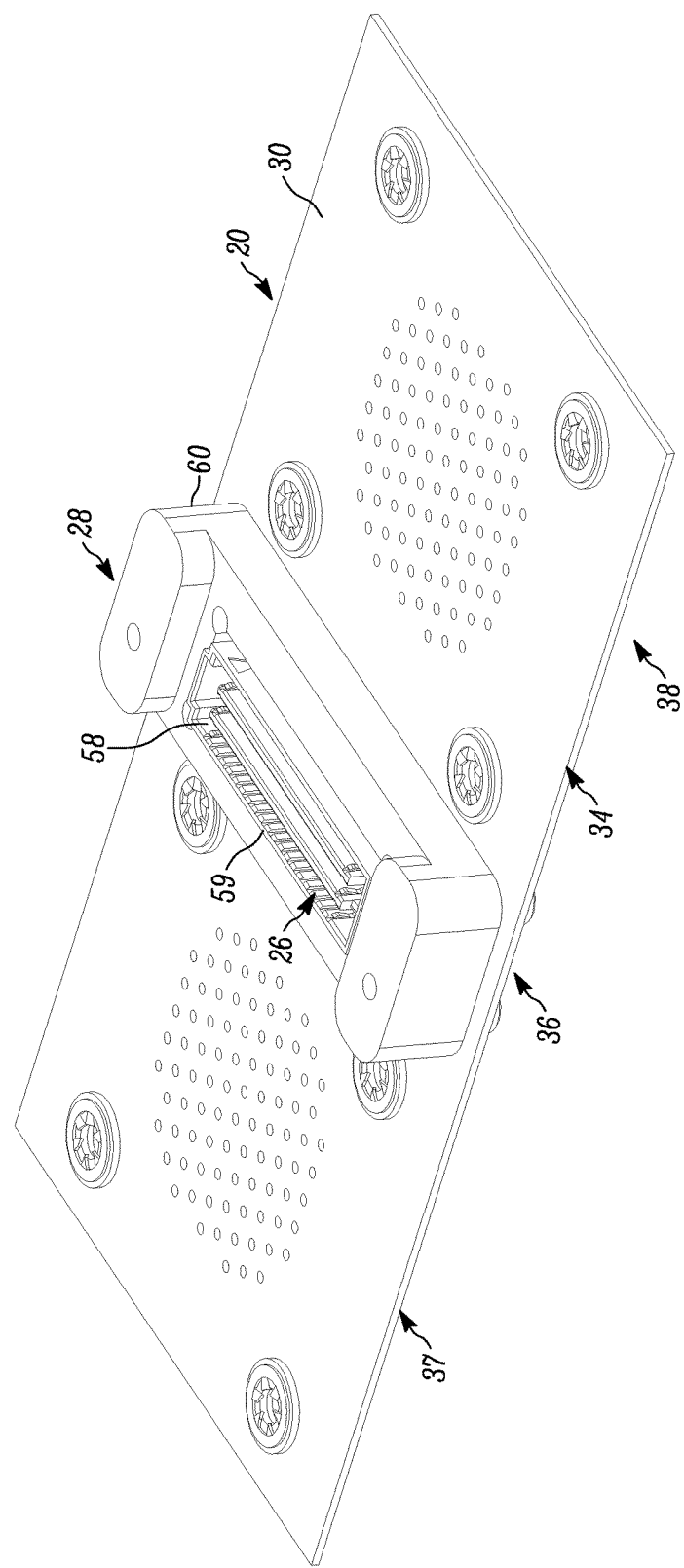
FIG. 3 of the drawings is a top perspective view of the board member of the adapter board assembly showing the connector attachment block positioned thereon.
Figure 4:
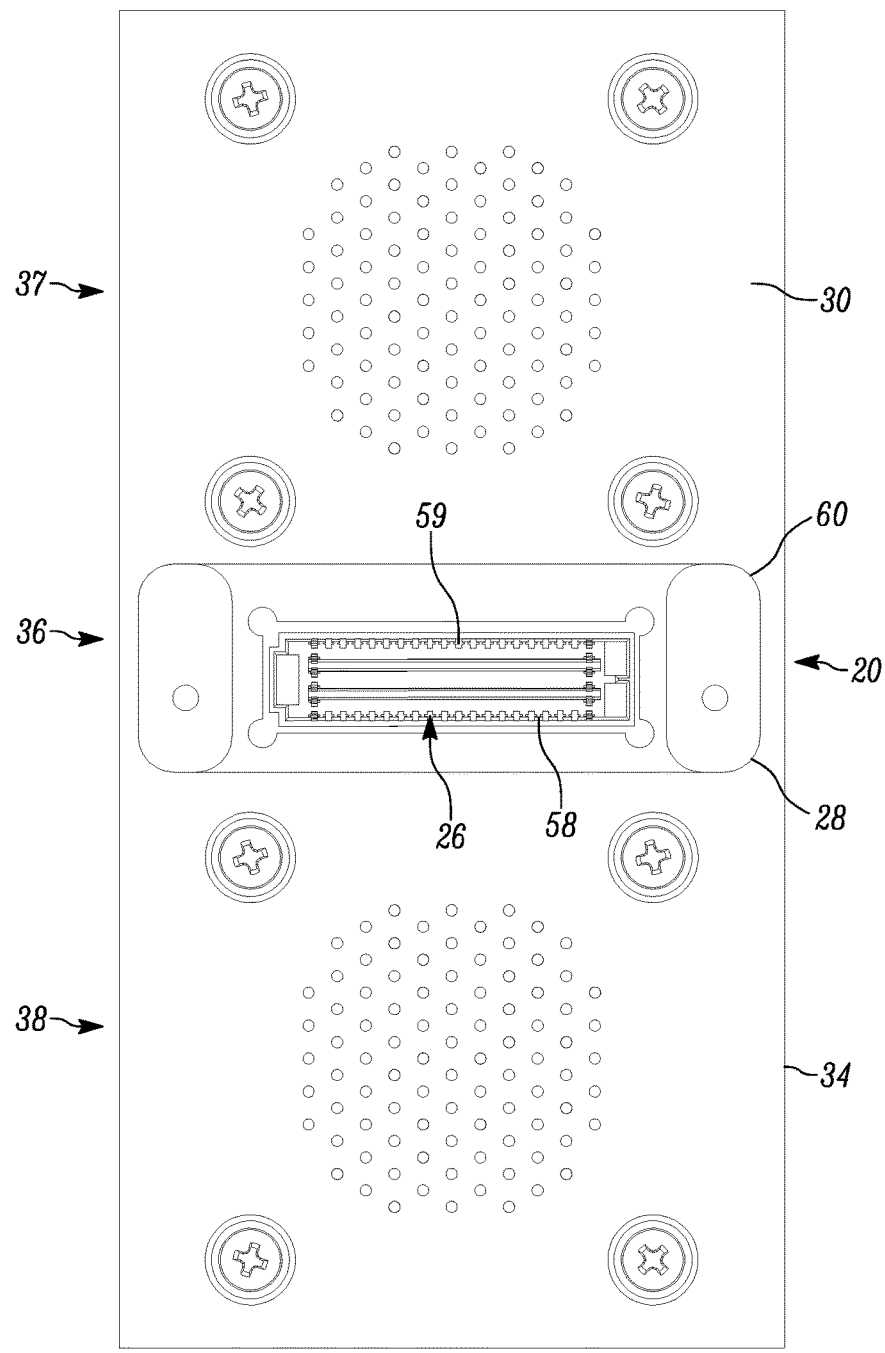
FIG. 4 of the drawings is top plan view of the board member of the adapter board assembly showing the connector attachment block positioned thereon.
Figure 5:
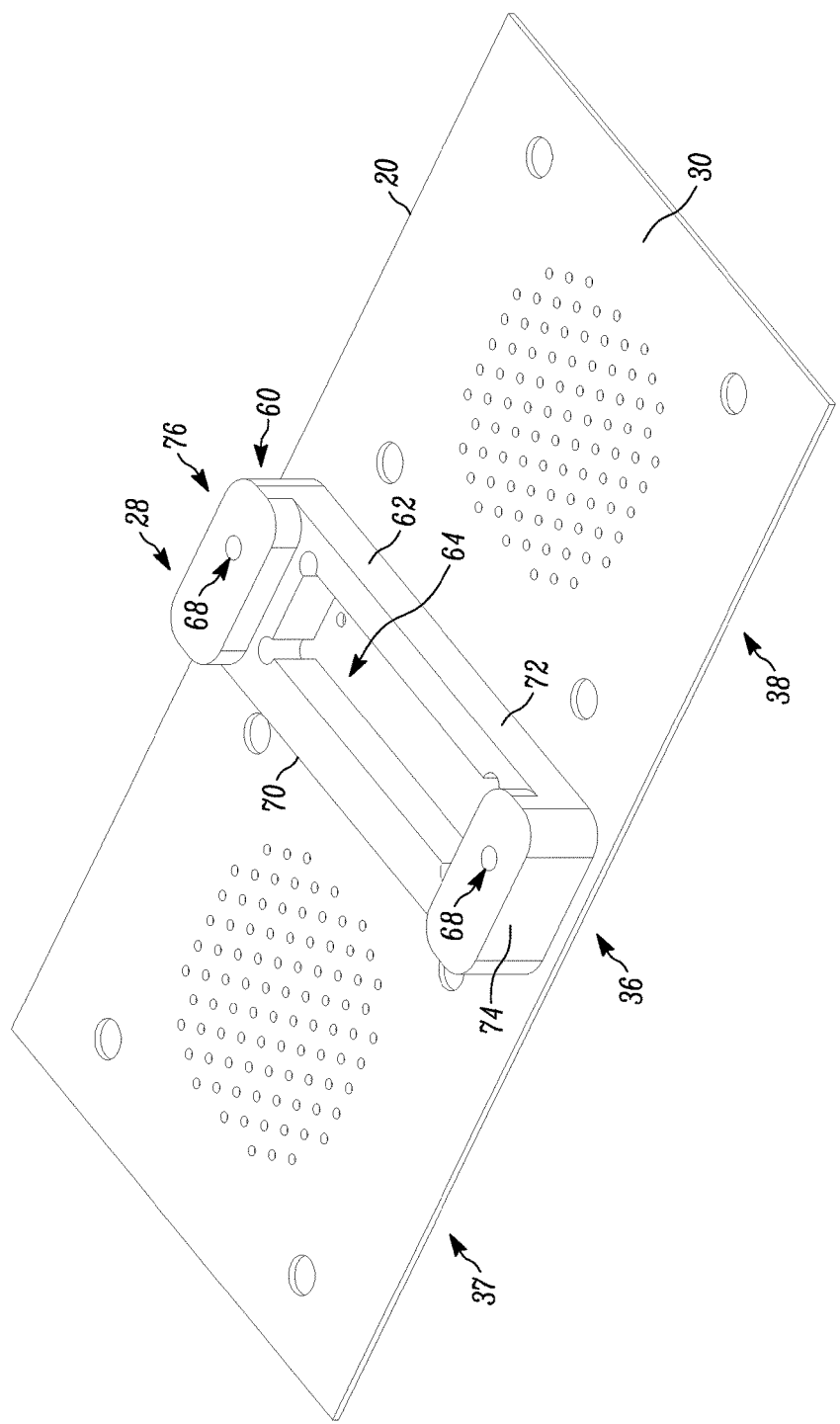
FIG. 5 of the drawings is a top perspective view of the board member of the adapter board assembly showing the connector attachment block positioned thereon.

While this invention is susceptible of embodiment in many different forms, there is shown in the drawings and described herein in detail a specific embodiment with the understanding that the present disclosure is to be considered as an exemplification and is not intended to be limited to the embodiment illustrated.

It will be understood that like or analogous elements and/or components, referred to herein, may be identified throughout the drawings by like reference characters. In addition, it will be understood that the drawings are merely schematic representations of the invention, and some of the components may have been distorted from actual scale for purposes of pictorial clarity.

Referring now to the drawings and in particular to FIG. 1, the adapter system is shown generally at 10. In the configuration shown, the adapter system is shown as including adapter board assembly 12 and electrical cable connector 14. The adapter system is configured to be positioned between conventional military connectors, such as, for example, MILSTD-1397C Type A, B, C or H, among others, and newer technologies, such as PCI, PMC, PCIe, cPCIe and cPCI so as to provide communication to newer technologies under NTDS. One such PCI board is shown at 200, with the understanding that such a board is positioned within a PCI slot of a computing device having such a PCI slot.

The adapter board assembly 12 is shown in FIG. 2 through 5 as comprising board member 20, first legacy connector 22, second legacy connector 24, high density connector 26 and connector attachment block 28. The board member 20 comprises a printed circuit board with leads (not shown) extending from the first and second legacy connectors 22, 24 to the high density connector 26. It will be understood that the board is not configured for use with any particular military connector having a particular number of pins. It will be understood that the pin configurations may include upwards of 85 and 92 pins, with fewer or greater numbers of pins also being contemplated. The particular connector, and the particular protocol is not limited to that which is shown, however, it is contemplated that the connectors are consistent with connectors such as, MILSTD-1397C Type A, B, C or H, among others.

More particularly, the board member 20 is a generally rectangular configuration of sufficient length and width to accommodate two legacy connectors and a high density connector therebetween, in the configuration shown. It will be understood that in the configuration shown, the board member 20 includes top 30, bottom 32 which are generally parallel to each other, defining a substantially uniform thickness. The board defines a generally rectangular perimeter 34, and the board includes three regions, the central portion 36, the first side portion 37 and the second side portion 38. In the configuration shown, the board member is generally symmetrical about the central portion 36, which includes the high density connector 26 with the first side portion and the second side portion each including the first and second legacy connectors.

The first legacy connector 22 is associated with the first side portion 37 and positioned so as to depend from the bottom 32. The first legacy connector includes mating housing 40, coupling mechanism 42 and connector pins 44. Generally, the mating housing 40 is cylindrical, with keyways or channels to insure proper orientation of a cable end prior to insertion. While not shown, for purposes of clarity, the outer surface of the mating housing 40 includes a threaded portion, which engages a threaded member on the cable for purposes of locking the cable to the mating housing.

The coupling mechanism 42 includes flange 46, spacers, such as spacer 47 and fasteners, such as fasteners 48. The flange 46 extends outwardly from the mating housing. The flange interfaces with a ledge on the mating housing so that when the flange 46 is coupled to the board member, the lower portion of the mating housing 40 is captured and sandwiched therebetween. The flange 46 is coupled to the board member through the fasteners 48, with the proper spacing being determined by the spacers 47 so that the fasteners are not overtightened to destroy either one of the flange and the board member. In the configuration shown, the first legacy connector 22 has a generally rectangular flange 46 with a fastener and spacer combination positioned at each of the corners. Of course, in other configurations, other strengthening or supporting mechanisms are contemplated for use, other than the coupling mechanism disclosed. It is also contemplated that a simple adhesive or the like may be employed wherein vibration and other sources of disruptive movement which may lead to dislocation of the connector or compromise of the board member, is not of concern.

The connector pins 44 extend into the connector mating housing 50 and extend to the board member 20. In the configuration shown, initially, the pins are extended through openings in the board member, and cut after the pins are soldered to corresponding leads on the board. The FIG. 1, shows the pins prior to cutting down to a height that extends just slightly over the top surface of the board. In the configuration shown, a total of between 85 and 92 pins is contemplated, while other connectors have a greater or lesser quantity of pins.

The second legacy connector 24 is a substantial mirror image of the first legacy connector and is positioned so as to be associated with the second side portion 38. The second legacy connector 24 includes mating housing 50, coupling mechanism 52 and connector pins 54. The coupling mechanism 52 includes flange 55, spacers, such as spacers 56 and fasteners, such as fasteners 57. The first and the second legacy connector appear as mirror images of each other about the high density connector 26.

The high density connector 26 includes housing portion 58 and electrical connections 59. In some configurations the high density connector may have electrical connections 59 in the form of substantially vertical pins, or holes to accept pins. In other configurations, the electrical connector may comprise a plurality of pins that are spaced apart on a slot (such as a centronics type connector). It is contemplated that a number of rows of connectors may be positioned within the housing portion 58. For example, it is contemplated that a connector be utilized, which connector may have upwards of 120 pins or connections. The disclosure is not limited to any particular type of high density connector, and a number of different connectors are contemplated for use.

Figure 6:
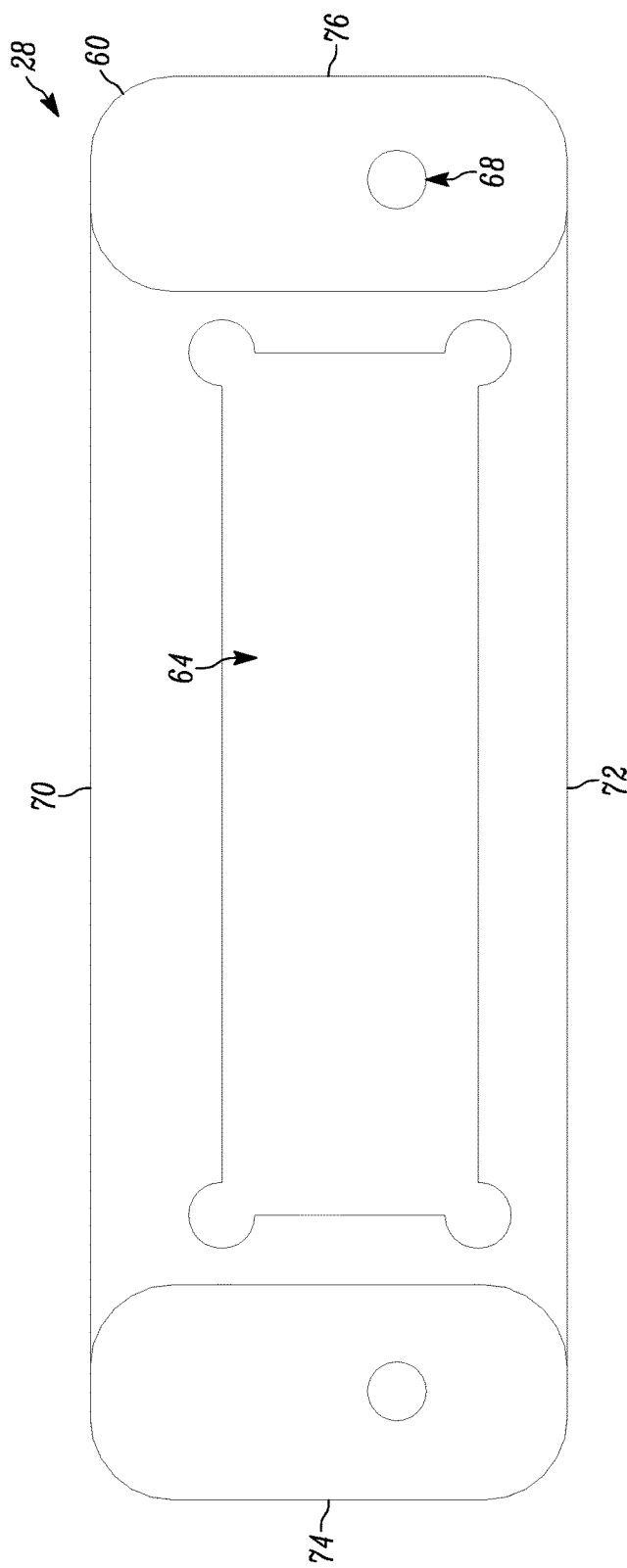
FIG. 6 of the drawings is a top plan view of the connector attachment block of the adapter board assembly of the present disclosure.
Figure 7:
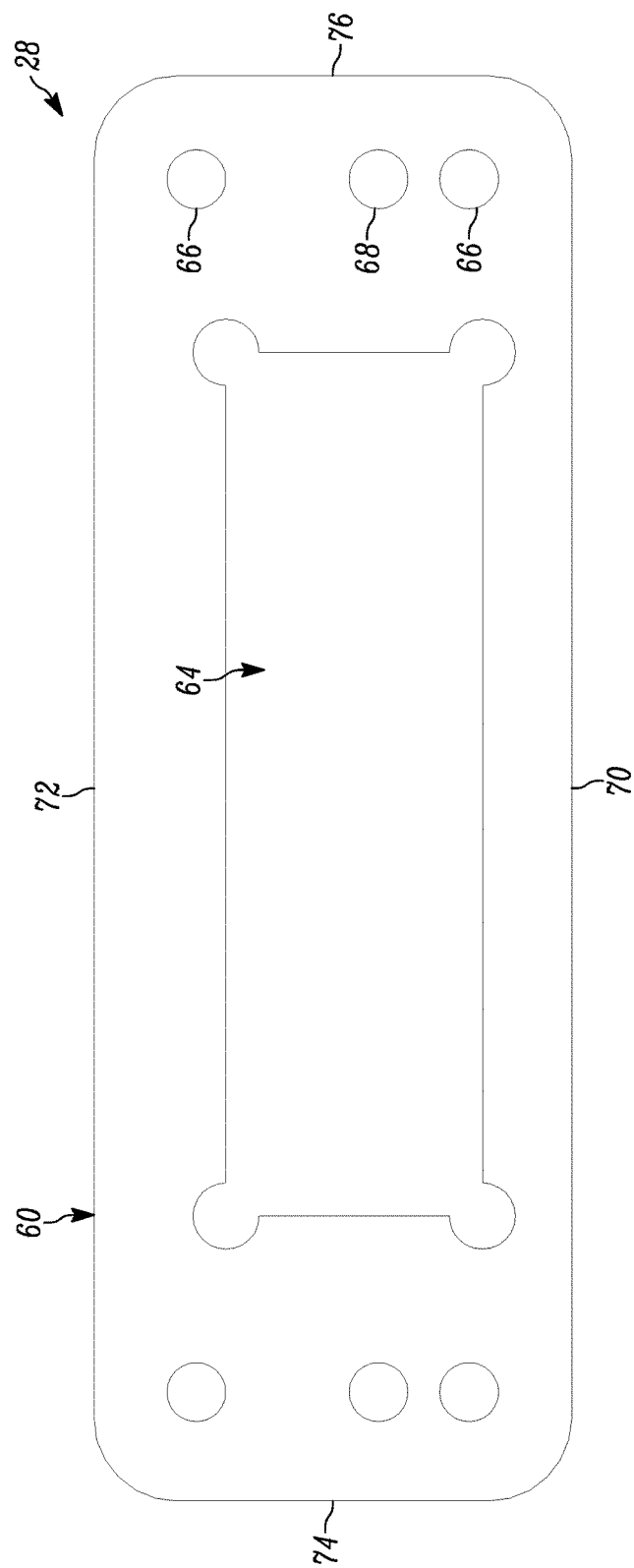
FIG. 7 of the drawings is bottom plan view of the connector attachment block of the adapter board assembly of the present disclosure.

With further reference to FIGS. 6 and 7, in addition to FIGS. 2 through 5, the connector attachment block 28 is positioned on the board member and extends about the high density connector 26 as a separate component from the high density connector housing, or the board member, in the preferred configuration. The connector attachment block includes body 60. In the configuration shown, the body 60 is formed from a conductive metal member, such as, for example, an aluminum member. The member may be milled or cast into the appropriate configuration. It is contemplated that other materials may be utilized, however, for grounding purposes, it is advantages, although not required, that a conductive material be utilized of adequate strength properties. It will be understood that the connector attachment block is on a surface opposite that of the first and second legacy connectors, however, it is contemplated that the three structures may be on the same side of the board. It has been found that by separating the structures on opposing sides, access to the high density connector is improved.

The body 60 of the connector attachment block 28 includes outer periphery 62, central opening 64, board coupling 66 and connector coupling 68. The outer periphery 62 of the body 60 includes first side 70, second side 72, first end 74 and second end 76. The two sides 70 are elongated as compared to the two ends, and are substantially parallel to each other. The two ends are also substantially parallel to each other and spaced apart from each other so as to be parallel. The sides and the ends cooperate to define a substantially rectangular perimeter. The outer parts of first and second ends are raised as compared to the first side and the second side (and in the configuration shown, as compared to the inner portions of the first side and the second side), so that the first and second ends extend away from the top of the board member a distance greater than the first and second side.

The central opening 64 is of a generally rectangular configuration and includes strain relief corners that so at to eliminate internal corners. The configuration is such that, due to the orientation of the central opening, the two ends are wider than the first and second sides. The central opening is configured so as to be of sufficient size that the high density connector can be accessed through the central opening. In the configuration shown, the shape of the connector may be trapezoidal, while the central opening is generally rectangular. It is contemplated that the central opening may more closely track the configuration of the connector.

The board coupling comprises a plurality of threaded bores that extend into the body of the connector attachment block, and most preferably at the first and second ends. In the configuration shown, a total of two threaded bores are positioned on each of the first and second ends. It will be understood that corresponding openings are found on the board member, such that fasteners can be extended through those openings and into each of the four threaded bores so that the fasteners sandwich the board member between the fastener and the connector attachment block. By utilizing the four spaced apart fasteners, the board is sandwiched across a relatively large surface area of the underlying connector attachment block. In other configurations, a greater or lesser number of fasteners may be utilized, and the spacing may be altered, along with the position of the threaded bores.

The connector coupling comprises a pair of corresponding threaded bores positioned on the top surface of the first and second ends of the outer periphery of the body. The two threaded bores are configured to accept corresponding fasteners of the first or second side coupling assembly so as to releasably attach the coupling assembly to the connector attachment block, and, in turn, to the underlying board member.

Figure 8A:
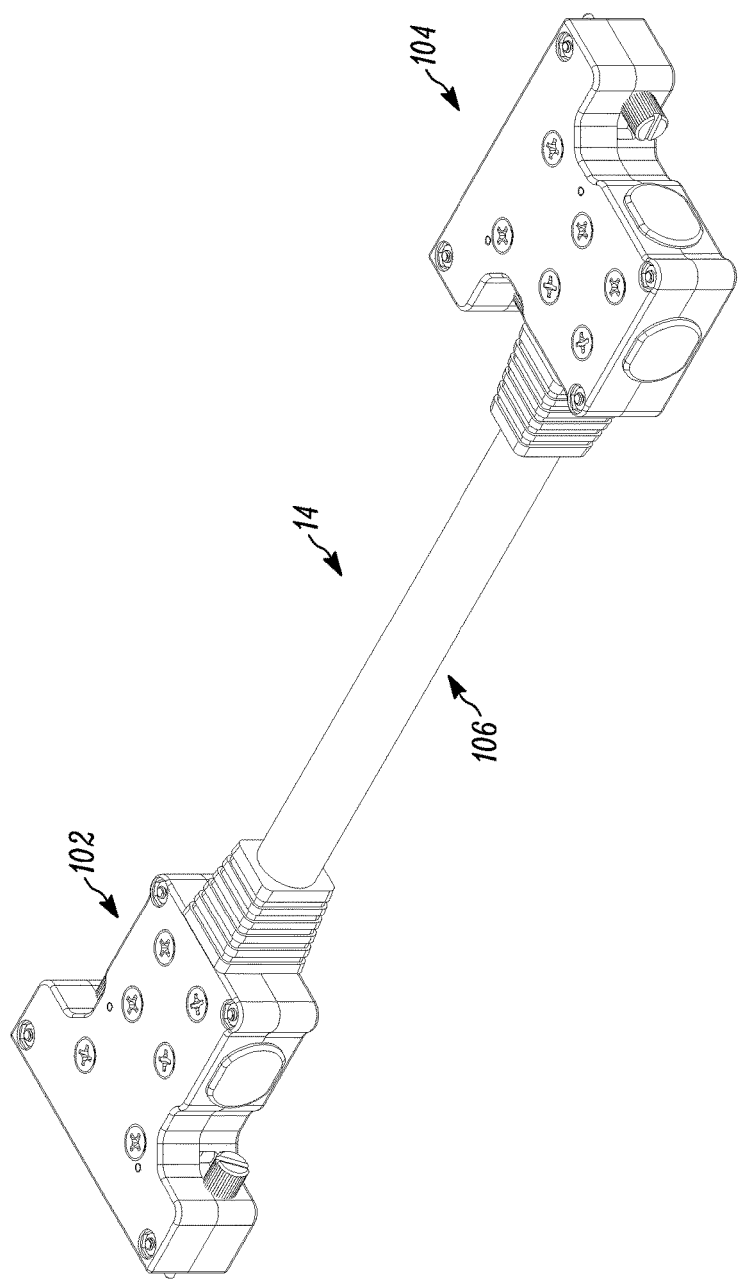
FIG. 8a of the drawings is a perspective view of an embodiment of the electrical cable connector, showing, in particular, the connectors in a collinear configuration.
Figure 8B:
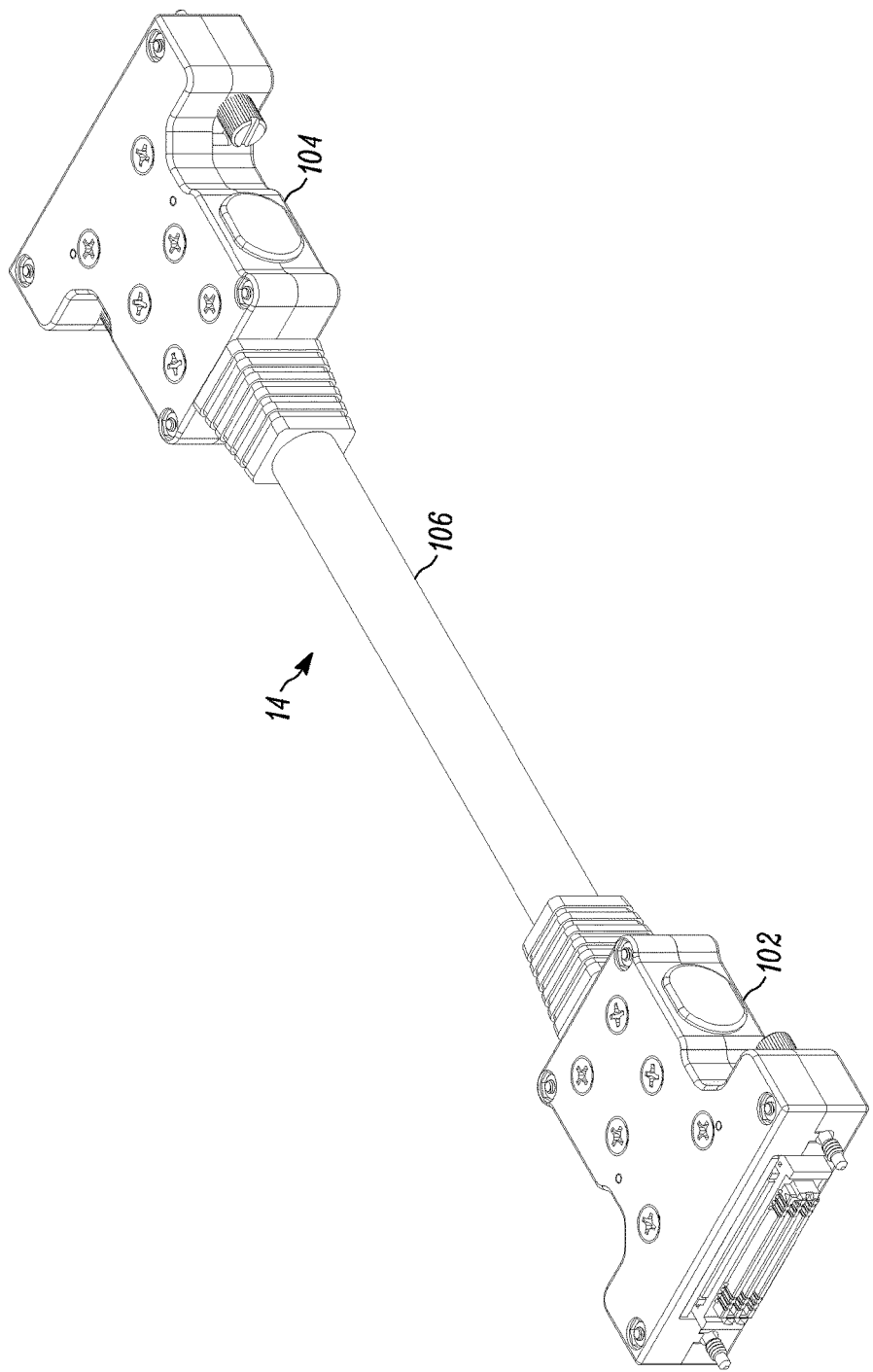
FIG. 8b of the drawings is a perspective view of another embodiment of the electrical cable connector, showing, in particular, the connectors in a right angle configuration.
Figure 9:
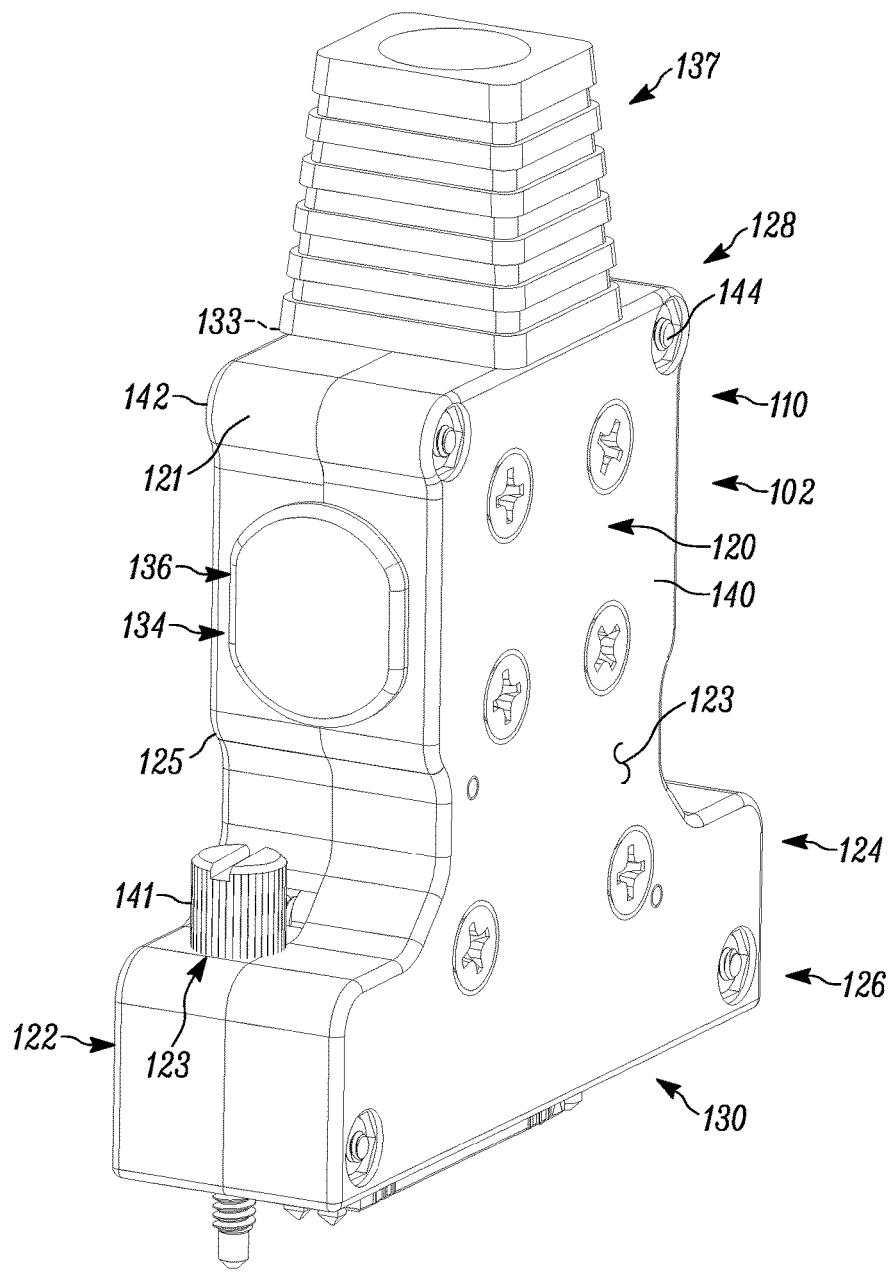
FIG. 9 of the drawings is front perspective view of the first side coupling assembly.
Figure 10:
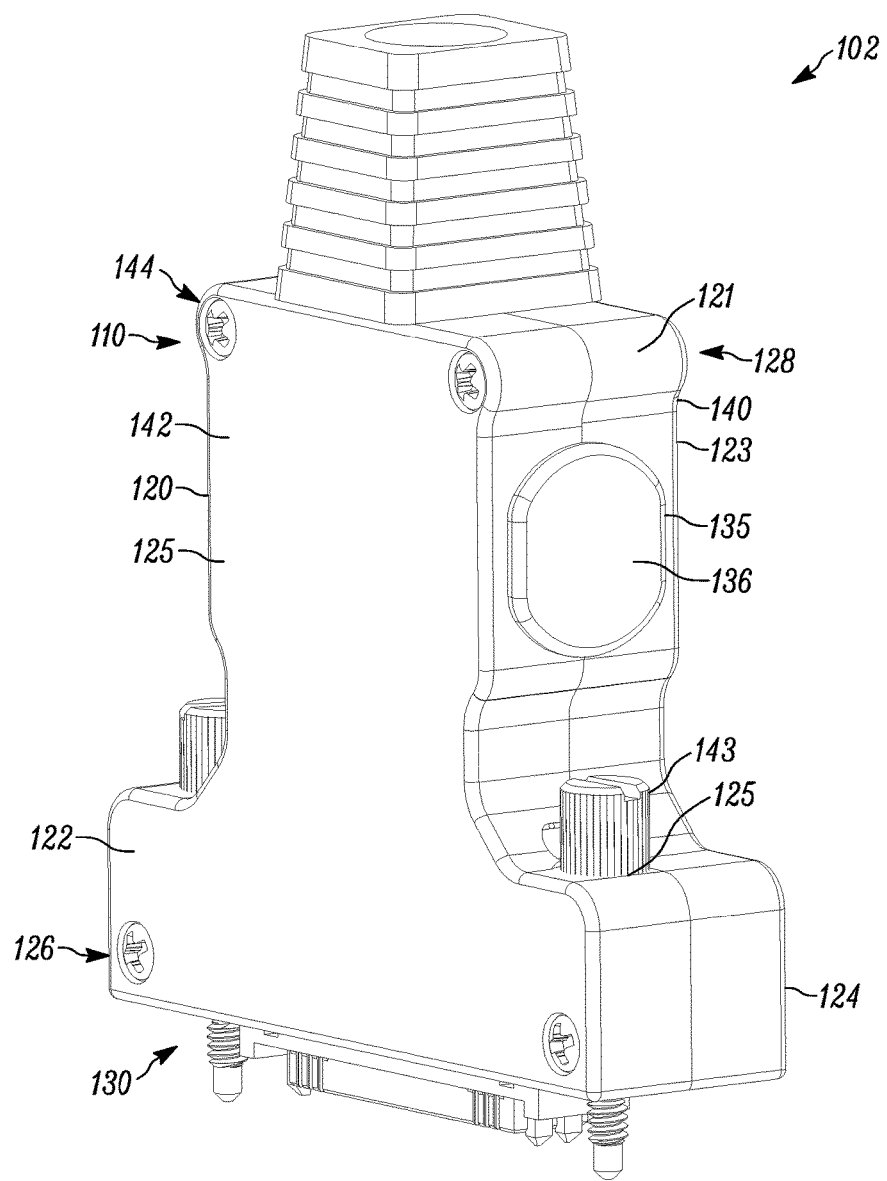
FIG. 10 of the drawings is a back perspective view of the first side coupling assembly.

With the adapter board assembly being fully set forth above, the electrical cable connector 14 which is configured to extend between the adapter board assembly and the outside computing device (i.e., the PCI card, or other interface, therewithin) is shown in FIG. 8a (in a first configuration) and FIG. 8b (in a second configuration). The electrical cable connector 14 includes first side coupling assembly 102, second side coupling assembly 104 and cable member 106. It will be understood that the configuration of the first side coupling assembly 102 and the second side coupling assembly 104 are substantially identical. As such, the first side coupling assembly will be described with the understanding that the second side coupling assembly is substantially identical thereto. It will further be understood that the orientation of the first side coupling assembly can be varied with respect to the second side coupling assembly and that different connectors may be found in each.

The first side coupling assembly 102 shown in FIG. 8b is shown in greater detail in FIGS. 9 through 13, as including housing 110 and electrical connector portion 112. The housing 110 is formed from two halves, namely first housing half 140 and second housing half 142, which are coupled together through a series of fasteners, such as mating fasteners 144. The two halves meet at a seam that extends along the spanning portion 121 between a front 123 and back surface 125 thereof. The housing 110 may be formed from more than two different halves, and may include other structures. That is, the housing halves may comprise multiple members that are coupled together. In addition, the halves may be attached together in a manner that precludes or limits separation thereof.

The housing 110 includes a proximal end 126 and a distal end 128. The lower connector opening 130 is positioned at the proximal end. The housing further includes central body portion 120, first retention wing 122, and second retention wing 124. The retention wings include a bore through which the fastener is directed. It will be understood that when in the operable configuration, the bores align with the connector couplings 68 of the connector attachment block. The first retention wing includes first fastener bore 123 and the second retention wing includes second fastener bore 125. The bores are generally perpendicular to the lower connector opening and generally parallel to the front and back surfaces of the first and second housing halves. Fasteners 141, 143 are extended through the bores. The fasteners may include a thumbscrew head which may be slotted or the like. Thus, a user can utilize a tool (such as a flathead screwdriver, or a Philips screwdriver or the like) or may just use his or her hand to tighten or loosen the fastener when coupled to the underlying connector attachment block. The housing may be formed from a metal member, which in combination with a copper shield surrounding the conductors of the electrical connector cable creates a Faraday cage minimizing electromagnetic interference. Dimensionally, in the configuration shown, the housing, at the proximal end is 2.34"×2.36" by 0.72", with the width near the distal end (i.e., beyond the retention wings so as to aid in handling) is 1.34". Of course, the disclosure is not limited to these dimensions. Additionally, the distance between the center of the housing to the bore for securing the same to the connector attachment block is 0.6", with variations contemplated.

The lower connector opening 130 is configured to receive a connector body to extend therethrough. In many configurations, the opening is sized so as to correspond to the connector, whereas in other configurations, the opening is sized to receive any number of different connectors without changes in the configuration of the opening.

A plurality of cable openings 132 are disposed along the spanning portion 121 at the distal end. In the configuration shown, a total of three different openings are presented on the housing, namely, the top cable opening 133, the first side cable opening 134 and the second side cable opening 135. The top cable opening is positioned on the spanning portion at the distal end thereof, with the first and second side cable openings extending on opposing sides of each other on the central body portion of the spanning portion. It will be understood that generally one of the opening is utilized, with a cover, such as cover 136 covering extending over the other two cable openings. It will further be understood that when a cable extends through the opening, a grommet such as grommet 137 may be utilized.

Figure 11:
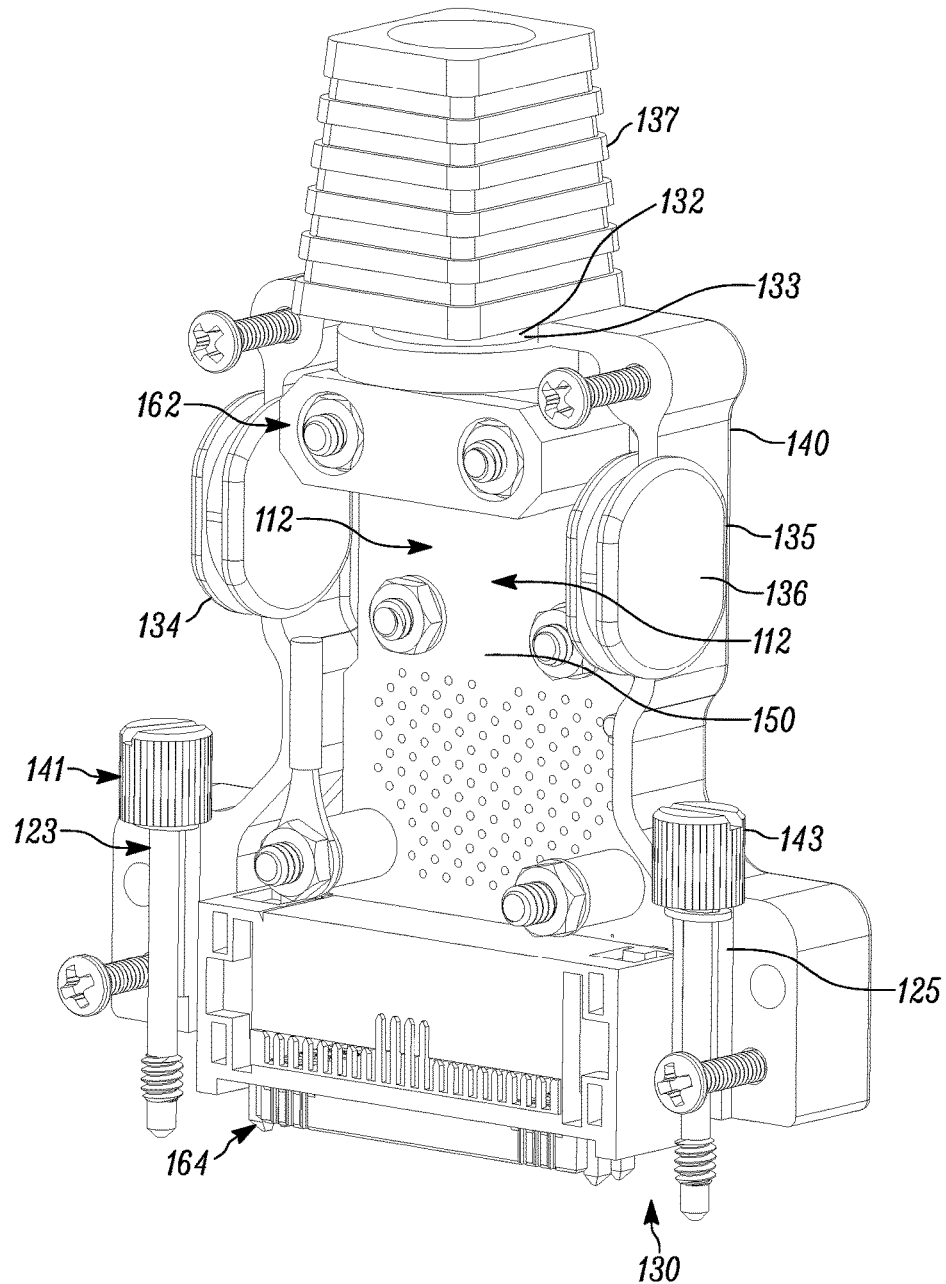
FIG. 11 of the drawings is a back perspective of the first side coupling assembly, with the second housing half removed so as to expose the electrical connector portion.
Figure 12:
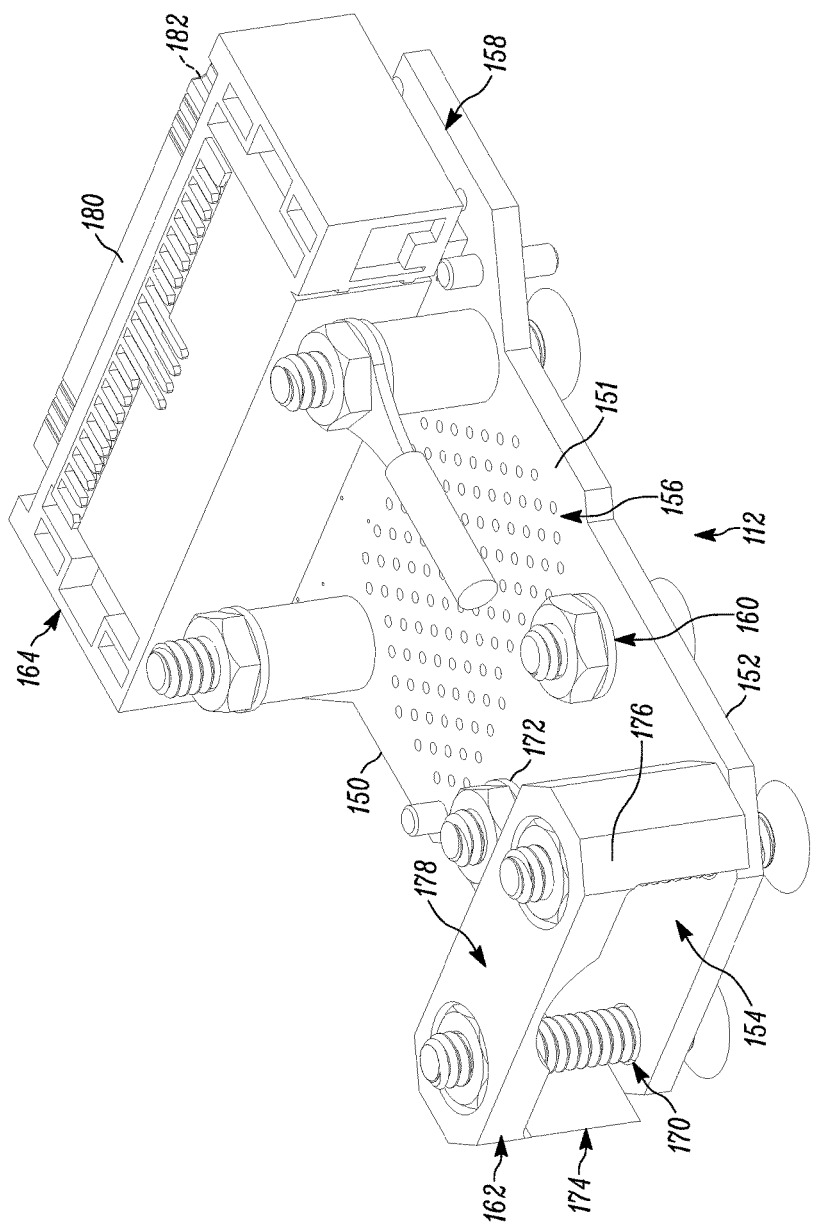
FIG. 12 of the drawings is a perspective view of the electrical connector portion of the present disclosure.
Figure 13:
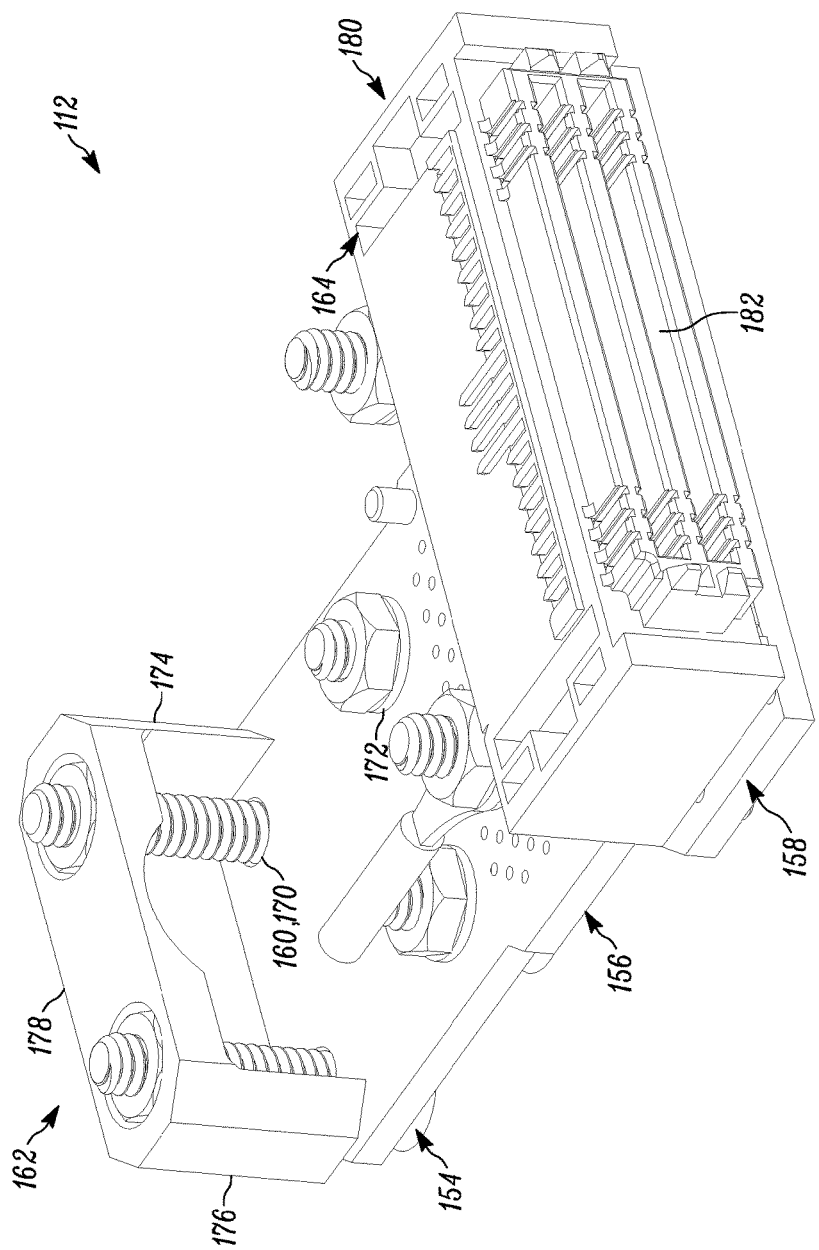
FIG. 13 of the drawings is a perspective view of the electrical connector portion of the present disclosure.

The electrical connector portion 112 is shown in FIGS. 11 through 13 as comprising board 150, cable clamp member 162 and connector member 164. The electrical connector portion 112 is positioned within the cavity of the housing, with the electrical connector member 164 extending out of the lower connector opening 130. The board 150 has a first side 151 and a second side 152. The board comprises a conventionally known printed circuit board. The board includes upper portion 154, central portion 156 and lower portion 158. The board generally fits within the cavity in a manner so as to be generally perpendicular to the front and back faces of the housing. A plurality of housing connector openings are presented on the board. Corresponding openings are positioned on the housing. As such fasteners can be extended through the openings of the housing and through the corresponding housing connector openings to secure the board to the housing half. Of particular interest are the openings at the upper portion of the board. The four fastener openings define a square such that for any opening, the opening above or below is spaced apart a distance equal to the spacing of the opening that is to the side of the other opening. These openings are configured, as will be explained, for the retention and placement of the cable clamp member in a plurality of different orientation.

Figure 14A:
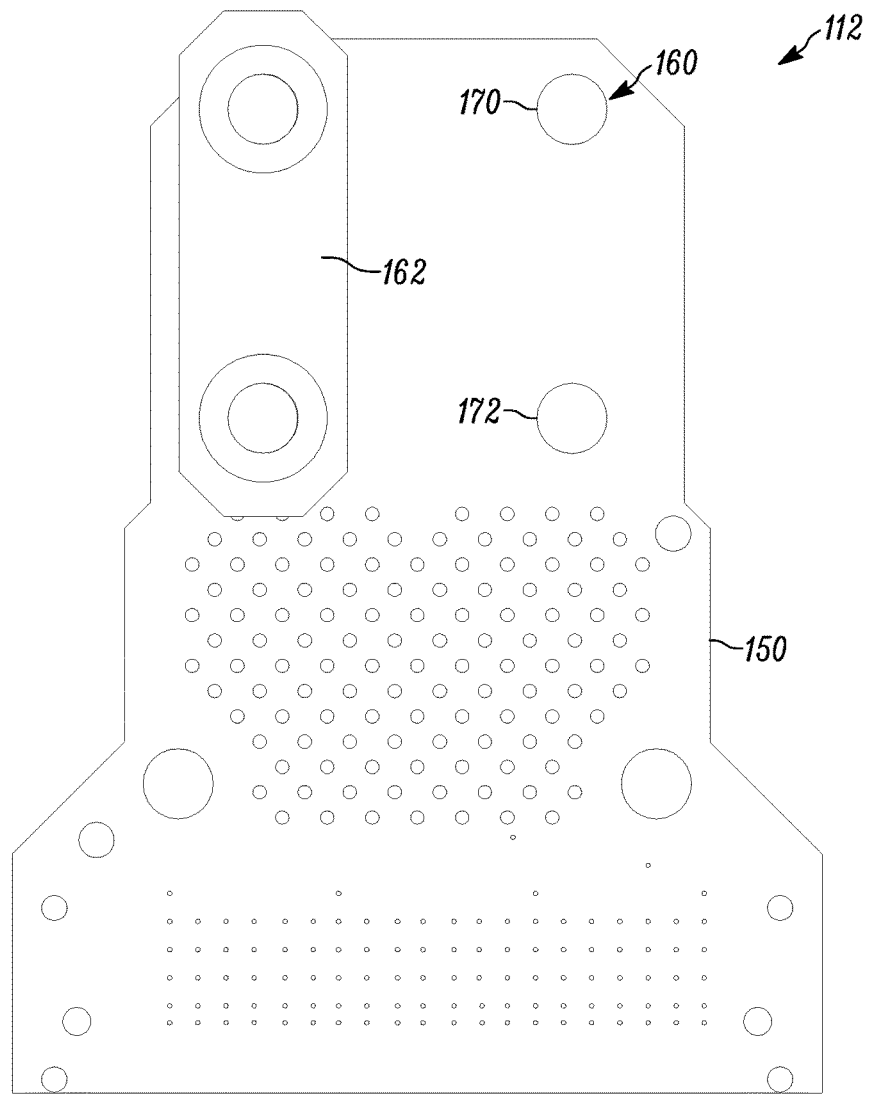
FIG. 14a of the drawings is top plan view of the board of the electrical connector portion showing, a first orientation of the cable clamp member.
Figure 14B:
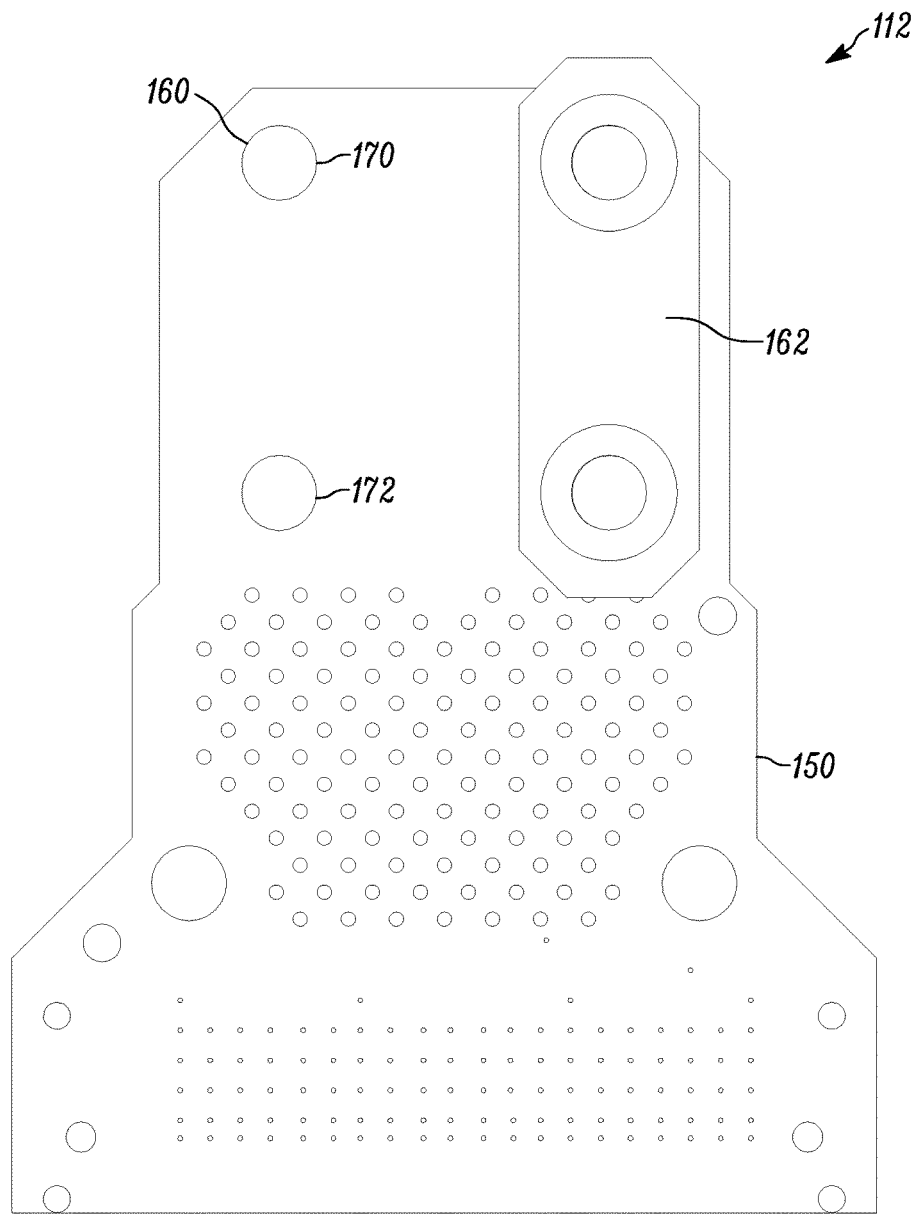
FIG. 14b of the drawings is a top plan view of the board of the electrical connector portion showing, a second orientation of the cable clamp member.
Figure 14C:
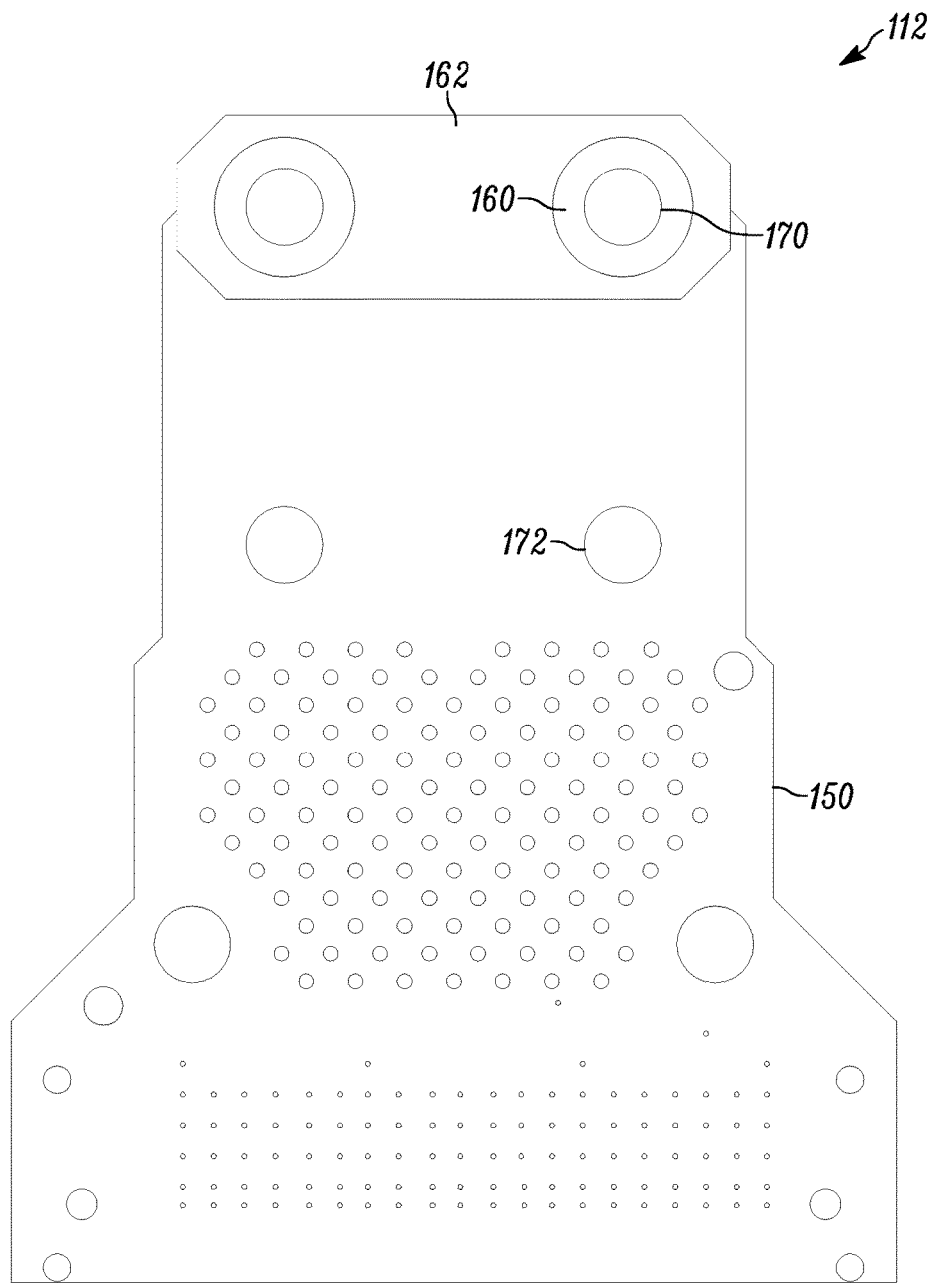
FIG. 14c of the drawings is a top plan view of the board of the electrical connector portion showing, a third orientation of the cable clamp member.

The cable clamp member 162 is shown as comprising first column 174, second column 176 and cross member 178 which defines a channel formed thereby. The first and second columns are spaced apart from each other a distance corresponding to the distance between the housing connector openings of the upper portion of the board 150 and an opening is provided through the cross member corresponding to the housing connector openings. As will be explained, and with reference to FIGS. 14a through 14c, depending on the orientation of the cable (that is, through which of the cable openings the cable is directed), the cable clamp member can be coupled to a different set of the housing connector openings to retain and clamp the cable between the cable clamp member and the board 150.

The connector 164 includes housing portion 180 and electrical couplings 182. As identified above, the connector 164 may comprise any one of a number of different types of connectors, of the type shown above. The housing portion 180 generally comprises a insulative member with the electrical couplings protected thereby. It will be understood that in the configuration shown, at least a portion of the housing portion extends out of the housing through the lower connector opening.

As explained above, the first side coupling assembly 102 and the second side coupling assembly 104 may be substantially identical. As such, similar structures on the second side coupling assembly 104 will be labeled with the same reference numbers as on the first side coupling assembly. It will further be understood that with either coupling assembly, the cable member can be coupled to any one of the openings, and attachment to one of the openings on one of the two coupling assemblies does not affect the cable openings of the other two coupling members. That is, the cable member may extend through a side opening on one of the two coupling members, while extending through the top of the other coupling member. Additionally, the two coupling assemblies may be associated with different connectors, or in other embodiments may be reversible.

The cable member 16 is shown in FIGS. 8a and 8b as comprising an outer sheath 186 having a plurality of individually isolated conductors (not shown). The particular number, size and thickness of the different insulated conductors is not limited, and it is contemplated that any number of different configurations are contemplated for use. It is contemplated that the outer sheath comprises a PVC jacket material or a low smoke (FEP) material, among others. Additionally, the conductors are contemplated to be surrounded by a copper shield that is coupled to the metal housing at either end.

The assembled configuration will be described with respect to the first side coupling assembly with the understanding that the second side coupling assembly is attached in the same manner to the underlying cable member. The cable member extends through a cable opening, such as through the top cable opening. A grommet 137 can be utilized to minimize damage to the cable member. The cable member extends into the cavity of the housing. It will be understood that the individual conductors are attached to the board proximate the central portion thereof, and along the openings shown in the central portion. These openings are connected by leads to the different electrical couplings 182 of the connector 164 of the electrical connector portion.

The board 150 is attached to the underlying housing half. To further couple the cable and to limit the stress and strain on the attachment of the conductor to the board (typically through a solder joint or the like), the cable clamp member can be utilized. In particular, the cable clamp is positioned so that the cross member 178 extends across the cable member with the opposing columns being positioned so that the openings of the cross member corresponds to the housing connector openings. Fasteners are then extended through the housing, the board and the cable clamp member to clamp the structures together, and at the same time to clamp the cable member between the cable clamp member and the board. Such clamping precludes additional strain on the solder joints at the end of the individual conductors within the cable member. It will be understood that the cable member is coupled in a similar manner to the second side coupling assembly.

Thus, to connect legacy military connectors to a board of a computing device, the user first attaches the adapter board assembly to the existing military connectors. In particular, the connectors are manipulated into the proper relative orientation so that the connector can be inserted into the mating housing of each of the legacy connectors. Once inserted, as explained, they can be coupled thereto through fasteners that engage with threaded ends of the mating housing (not shown). Such connection fasteners are well known in association with legacy military connectors.

Once connected, the electrical cable connector can be attached to the adapter board assembly. In particular, the connector 164 of the first side coupling assembly 102 can be attached to the high density connector 26 of the adapter board assembly. Once these are electrically coupled, and in the proper orientation relative to each other, the first and second fastener bores on the first side coupling assembly align with the connector couplings 68 of the connector attachment block. The fasteners 141, 143 can then be driven therethrough so as to couple the first side coupling assembly to the adapter board assembly. As can be appreciated, by attachment of the board member 20 to the connector attachment block, and by attachment of the first side coupling assembly to the connector attachment block, the stress placed upon the connector, and the underlying solder joints thereof can be minimized. The connector attachment block further spreads the forces of the connector across a relatively larger area of the board member, and with multiple couplings between the board member and the connector attachment block, the potential of damage to the board member is likewise minimized.

On the other side, the second side coupling assembly is attached to the card (i.e., a PCI card or other card) that is to be attached to an existing computing device, or is already positioned in and electrically coupled to a computing device (not shown). In the configuration shown, the first and second side connectors are at a 90° relative to each other. It will be understood that they may be collinear, or may be perpendicular as shown. Advantageously, the structure is configured so as to be usable and mountable in any one of the three orientations, without requiring any different parts or the like, and with the same components.

The foregoing description merely explains and illustrates the invention and the invention is not limited thereto except insofar as the appended claims are so limited, as those skilled in the art who have the disclosure before them will be able to make modifications without departing from the scope of the invention.

What is claimed is:

1. An adapter system comprising:
an adapter board assembly including:
a board member having a central portion, a first side portion, and a second side portion, a top surface and a bottom surface;
a first legacy connector directly attached to and extending from the bottom surface of the board member, structurally configured to receive a first legacy military connector and electrically coupling thereto;
a second legacy connector directly attached to and extending from the bottom surface of the board member, structurally configured to receive a second legacy military connector and electrically coupling thereto;
a high density connector directly attached to and extending from one of the top surface and the bottom surface of the board member, the high density connector electrically coupled to the first and second legacy connectors, to, in turn, electrically couple the high density connector with the first and second legacy military connectors; and
a connector attachment block extending about the high density connector, and being separable therefrom, the connector attachment block including a board coupling configured to couple the connector attachment block directly to the board member, and including a connector coupling on an upper surface of the outer periphery; and
an electrical cable connector, the electrical cable connector having a first side coupling assembly, a second side coupling assembly and a cable member extending therebetween, the first side coupling including a connector matingly electrically attachable to the high density connector of the adapter board assembly, and further including a housing, with the housing having a fastener attachable to the connector coupling of the connector attachment block to releasably couple the housing of the first side coupling assembly to the connector attachment block, to, in turn, maintain an electrical coupling between the high density connector and the connector of the first side coupling assembly.

2. The adapter system of claim 1 wherein the connector attachment block further includes an outer periphery defining a central opening, with the high density connector accessible within the central opening.

3. The adapter system of claim 2 wherein the outer periphery defines a rectangular member having a first side, a second side, a first end and a second end, with the board coupling comprising a plurality of threaded bores configured to receive fasteners which sandwich the board member therebetween, the plurality of threaded bores extending into the first end and the second end of the outer periphery.

4. The adapter system of claim 3 wherein at least a portion of the first and second ends extending further away from the board member to define a height that is greater than a height of the first side and the second side, with the connector coupling further comprising a corresponding threaded bore positioned on a top surface of each one of the first end and the second end of the outer periphery.

5. The adapter system of claim 4 wherein the connector attachment block comprises a monolithic integrally formed member.

6. The adapter system of claim 5 wherein the connector attachment block is formed from an electrically conductive material.

7. The adapter system of claim 4 wherein the housing of the first side coupling assembly includes a central body portion, a first retention wing, and a second retention wing opposite of the first retention wing, each of the first and second retention wings having a bore extending therethrough, corresponding to the threaded bores of the connector coupling of the connector attachment block, with a releasably threaded fastener configured to extend through a bore of the first retention wing and into one of the threaded bores of the connector attachment block, with a second releasably threaded fastener configured to extend through the bore of the second retention wing and into a second one of the threaded bores of the connector attachment block, upon electrical coupling of the high density connector with the connector of the electrical cable connector.

8. The adapter system of claim 7 wherein the housing of the first side coupling assembly further includes a plurality of cable openings, including a top cable opening, a first side cable opening and a second side cable opening, with the openings of the first and second side being substantially parallel to each other, and the top cable opening being substantially perpendicular thereto, the cable member extending through one of the plurality of cable openings, with a cover being positioned over the other of the cable openings.

9. The adapter system of claim 1 wherein the first legacy connector and the second legacy connector each further comprise:
a mating housing comprising a cylindrical member, a coupling mechanism extending between the mating housing and the board member, and a plurality of connection pins positioned within the mating housing and electrically coupled to the board member.

10. The adapter system of claim 9 wherein the coupling mechanism further comprises a flange member extending from the coupling mechanism, and a plurality of fasteners extending between the flange member and the board member.

11. The adapter system of claim 1 wherein the first and second legacy connectors extend from the bottom surface of the board member, and the high density connector extends from the top surface of the board member wherein the high density connector is positioned on the central portion of the board member, with the first legacy connector being positioned on the first side portion of the board member and the second legacy connector being positioned on the second side portion of the board member.

12. An adapter board assembly for use in association with an adapter system, the adapter board assembly including:
a board member having a central portion, a first side portion, and a second side portion, a top surface and a bottom surface;
a first legacy connector directly attached to and extending from the bottom surface of the board member, structurally configured to receive a first legacy military connector and electrically coupling thereto;
a second legacy connector directly attached to and extending from the bottom surface of the board member, structurally configured to receive a second legacy military connector and electrically coupling thereto;
a high density connector directly attached to and extending from one of the top surface and the bottom surface of the board member, the high density connector electrically coupled to the first and second legacy connectors, to, in turn, electrically couple the high density connector with the first and second legacy military connectors; and
a connector attachment block extending about the high density connector, and being separable therefrom, the connector attachment block including a board coupling configured to couple the connector attachment block directly to the board member, and including a connector coupling on an upper surface of the outer periphery.

13. The adapter system of claim 12 wherein the connector attachment block further includes an outer periphery defining a central opening, with the high density connector accessible within the central opening.

14. The adapter board member of claim 13 wherein the outer periphery defines a rectangular member having a first side, a second side, a first end and a second end, with the board coupling comprising a plurality of threaded bores configured to receive fasteners which sandwich the board member therebetween, the plurality of threaded bores extending into the first end and the second end of the outer periphery.

15. The adapter board member of claim 14 wherein at least a portion of the first and second ends extending further away from the board member to define a height that is greater than a height of the first side and the second side, with the connector coupling further comprising a corresponding threaded bore positioned on a top surface of each one of the first end and the second end of the outer periphery.

16. The adapter board member of claim 12 wherein the first legacy connector and the second legacy connector each further comprise:
a mating housing comprising a cylindrical member, a coupling mechanism extending between the mating housing and the board member, and a plurality of connection pins positioned within the mating housing and electrically coupled to the board member.

17. The adapter system of claim 16 wherein the coupling mechanism further comprises a flange member extending from the coupling mechanism, and a plurality of fasteners extending between the flange member and the board member.

18. An electrical cable connector comprising:
a first side coupling assembly,
a second side coupling assembly; and
a cable member extending therebetween,
at least one of the first side coupling and the second side coupling further including:
a housing including a central body portion as well as a first retention wing and a second retention wing, each flanking a lower connector opening at a proximal end thereof, the housing further including a plurality of cable openings at a distal end thereof; and
an electrical connector portion including a board attached to the housing, a cable clamp member attached to the board, and a connector electrically coupled to the board, the connector extending at least partially through the lower connector opening of the housing,
wherein the cable member is configured to extend through one of the plurality of cable openings and electrically attachable to the board and to the connector.

19. The electrical cable connector of claim 18 wherein the plurality of cable openings further includes a top cable opening, a first side cable opening and a second side cable opening, the top cable opening being perpendicular to each of the first side and the second side cable openings, with the cable clamp member being positionable in a different orientation relative to the board, a first orientation when the cable member extends through the top cable opening, a second orientation when the cable member extends through the first side cable opening and a third orientation when the cable member extends through the second side cable opening.

20. The electrical cable connector of claim 19 wherein the cable clamp member includes a first column, a second column spaced apart from the first column, with a cross member extending therebetween to define an opening, whereupon coupling of the cable clamp member to the board sandwiches the cable member between the cross member and the board to, releasably retain the cable member therebetween.

* * * * *